(12) United States Patent
Singh et al.

(10) Patent No.: US 6,858,459 B2
(45) Date of Patent: Feb. 22, 2005

(54) METHOD OF FABRICATING MICRO-MIRROR SWITCHING DEVICE

(75) Inventors: Janak Singh, Singapore (SG); Uppili Sridhar, Singapore (SG); Ranganathan Nagarajan, Singapore (SG); Quanbo Zou, Singapore (SG)

(73) Assignee: Institute of Microelectronics, Singapore (SG)

( * ) Notice: Subject to any disclaimer, the term of this patent is extended or adjusted under 35 U.S.C. 154(b) by 0 days.

(21) Appl. No.: 10/154,279

(22) Filed: May 23, 2002

(65) Prior Publication Data

US 2003/0218227 A1 Nov. 27, 2003

(51) Int. Cl.[7] ............................................. H01L 21/00
(52) U.S. Cl. .......................................... 438/52; 438/72
(58) Field of Search ............................. 438/50, 52, 72

(56) References Cited

U.S. PATENT DOCUMENTS

| | | | |
|---|---|---|---|
| 5,537,083 A | 7/1996 | Lin et al. | 333/186 |
| 5,719,069 A * | 2/1998 | Sparks | 438/50 |
| 5,998,816 A * | 12/1999 | Nakaki et al. | 257/254 |
| 5,999,303 A | 12/1999 | Drake | 359/224 |
| 6,210,988 B1 | 4/2001 | Howe et al. | 438/50 |
| 6,479,315 B1 * | 11/2002 | Zosel et al. | 438/69 |

* cited by examiner

*Primary Examiner*—Howard Weiss
(74) *Attorney, Agent, or Firm*—George O. Saile; Stephen B. Ackerman

(57) ABSTRACT

Method of fabricating a micro-mirror switching device in single crystal silicon are described. The device is fabricated as three main elements: silicon mirror plate with metal-mirror, secondary actuator, and hinge/spring mechanism to integrate the mirror plate with the actuator. p-n junction is first formed on p-type silicon. Trenches are then etched in n-silicon to define the device element boundaries and filled with silicon dioxide. Three layers of sacrificial oxide and two structural poly-silicon layers are deposited and patterned to form device elements. Novel release processes, consisting of backside electrochemical etching in potassium-hydroxide, reactive ion etching to expose oxide-filled trenches from the bottom, and hydrofluoric acid etching of sacrificial oxide layers and oxide in silicon trenches, form the silicon blocks; those that are not attached to structural poly-silicon are sacrificed and those that are attached are left in place to hold together the switching device elements.

27 Claims, 7 Drawing Sheets

METHOD OF FABRICATING MICRO-MIRROR SWITCHING DEVICE

BACKGROUND OF THE INVENTION (1) Field of the Invention

The present invention relates generally to the method of fabricating micro-machined micro-mirror switching device and more particularly to fabricate metallic mirrors on single crystal silicon substrate.

(2) Description of the Prior Art

After its first conception in the 80's as a display device, MEMS (micro electro-mechanical system) micro-mirrors have come a long way in revolutionizing the data transport in communication networks. This area has been of particular interest for people involved in MEMS, in the past ten years. Micro-mirror devices have applications in display devices as a pixel, scanner type of display device. Light beam steering using micro-mirrors is being exploited in optical communication networks. MEMS based optical cross connect devices are being used in long haul networks to select and switch the light data signals without converting them to electronic domain. A large number of micro-mirror designs and mechanisms have been proposed. Surface micro machining is the most commonly used method for fabricating micro-mirror devices. Thin films such as poly-silicon, silicon dioxide, silicon nitride, and metal films such as aluminum, gold, chromium, and titanium have been used to develop micro-mirror devices for various applications. Some other researchers have used silicon-on-oxide MEMS, deep RIE SCREAM process, and in some cases backside aqueous potassium hydroxide etching to fabricate micro-mirror devices. In most devices, torsion springs or free hinges together with comb-drive or gap closing electrostatic actuators have been used.

U.S Pat. No. 5,537,083 describes a micro mechanical filter having planar components and fabricated using integrated circuit micro fabrication techniques. The mechanical coupling between input and output transducers includes planar fixtures, displacement of the electrodes producing bending of the elements of the fixtures. Processes include depositing electrical signal processing circuitry on a substrate, depositing interface components between signal processing circuitry and a mechanical filter in a first layer; depositing in a second layer components of the mechanical filter.

U.S. Pat. No. 5,999,303 describes an optical head utilizing a micro machined element in combination with a light source and a lens to read and write data onto a storage disk. A micro-machined element may include a tethered steerable micro-machined mirror. A movement of the micro machined mirror alters a beam of laser light transmitted from the light source to the optical head and a reflected light beam from the storage disk.

U.S. Pat. No. 6,210,988 B1 relates to micro-electromechanical systems using silicon-germanium films. The process includes depositing a sacrificial layer of silicon-germanium (SiGe) onto the substrate; depositing a structural layer of SiGe onto the sacrificial layer, where the germanium (Ge) content of the sacrificial layer is greater than the Ge content of the structural layer; and removing at least a portion of the sacrificial layer.

SUMMARY OF THE INVENTION

Accordingly, it is a primary object of the invention to describe the design of single crystal silicon micro-mirror switching device.

Another object of the invention is to describe the design of micro-mirror switching device elements, mirror plate, secondary actuator, and spring/hinge mechanism.

A further object of the invention is to provide a method for forming the MEMS micro-mirror switching device.

Yet another object of the invention is to provide methods for forming the elements of micro mirror-switching device, micro-mirror, actuator, and hinge/spring mechanism.

Another object of the invention is a method for implementing the angular amplification design using silicon as both structural and sacrificial layers.

In accordance with these objectives, design and a method of fabricating the said micro-mirror switches are described. The switch has three elements: single crystal silicon (SCS) mirror plate, secondary actuator, and hinge/spring mechanism to integrate the mirror plate with secondary actuators. The actuator moves the micro-mirror through spring and hinge mechanism. The actuator in this invention is of the electrostatic type or of the thermal type. A p-n junction is first formed on p-type silicon by growing n-type silicon on p-type wafers. Trenches are then formed to define the closed loop rectangular boundaries for micro-mirror plate, actuator electrodes, and other components to be fabricated in SCS. After filling the trenches with silicon dioxide, the wafer surface is planarized using chemical mechanical polishing or other etch-back processes. The planarized wafer is then used to fabricate top actuator electrode, interconnects, metal pads etc. Next, a sacrificial silicon dioxide layer-1 is deposited and patterned. Protective layers of silicon nitride and poly-silicon are then deposited and patterned. Next, another sacrificial silicon dioxide layer-2 is deposited on which a layer of structural poly silicon layer-1 is formed and patterned. This step is followed by the deposition of another sacrificial silicon dioxide layer-3 that is patterned. Structural poly-silicon-2 layer is then deposited and patterned. In the next step, mirror metal is deposited and patterned to form mirror. Device formation is completed using the release processes to selectively cut desired structures in single crystal silicon, while sacrificing remaining SCS blocks.

BRIEF DESCRIPTION OF THE DRAWINGS

The objects, advantages, and details of fabricating the SCS micro mirror-switching device according the design concept of this invention will be more clearly understood from the following detailed description taken in conjunction with the accompanying drawings.

Due to the asymmetry of the device layout, the process is described hereafter using two sets of cross-sections (shown by arrows in FIG. 1), each cross-section shown at various steps of the processing sequence. Each of the process steps cannot be shown on both the cross-sectional views, although the wafer sees all the process steps in entirety.

Figure 1:
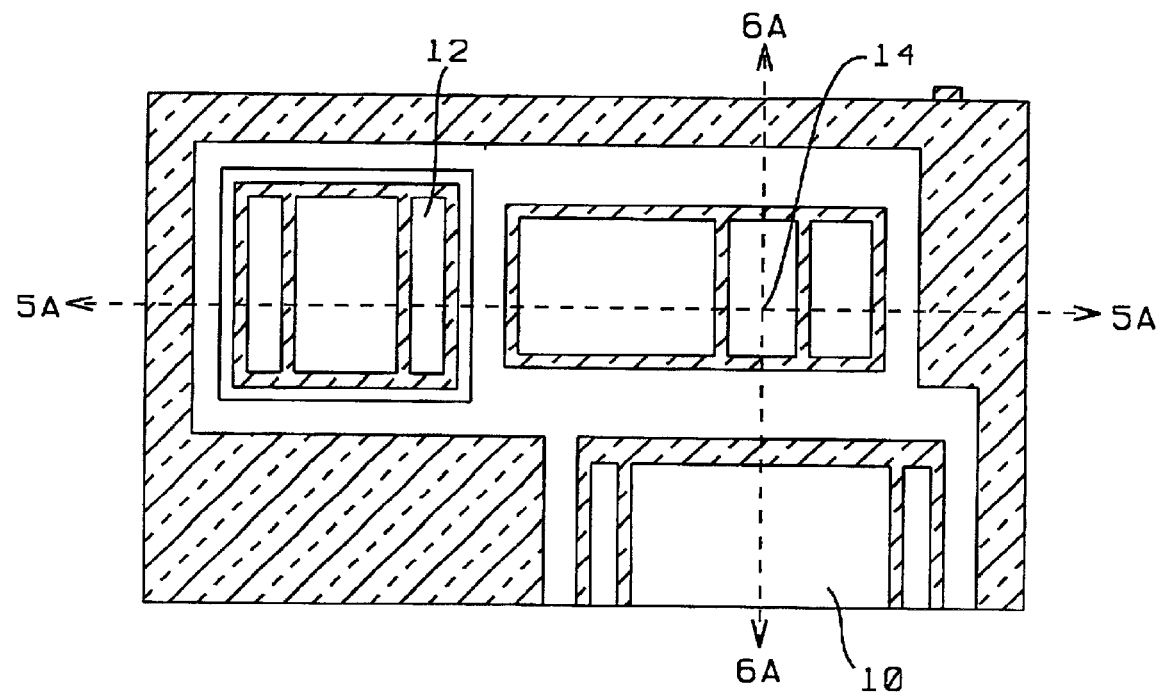
FIG. 1 shows the top view of the switching device, with major components indicated by arrows.

FIGS. 5a through 5h are cross-sectional views of the device along axis 5A shown in FIG. 1.

FIGS. 6a through 6h are cross-sectional views of the device along axis 6B shown in FIG. 1.

Figure 5A:
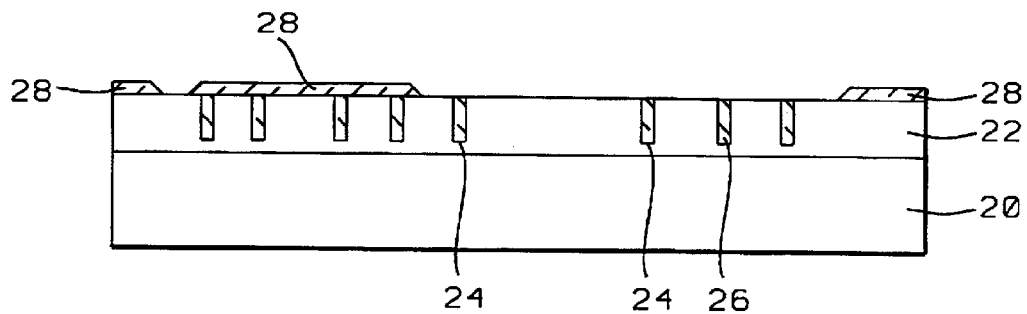
Figure 6A:
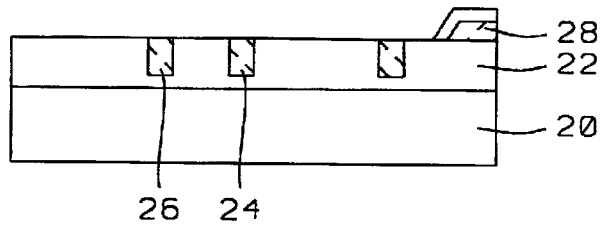

FIGS. 5a and 6a are cross-sectional views of the device after deep trenches are etched, filled with silicon dioxide and planarized; sacrificial silicon dioxide layer-1 (sac-1) deposition and etching.

Figure 5B:
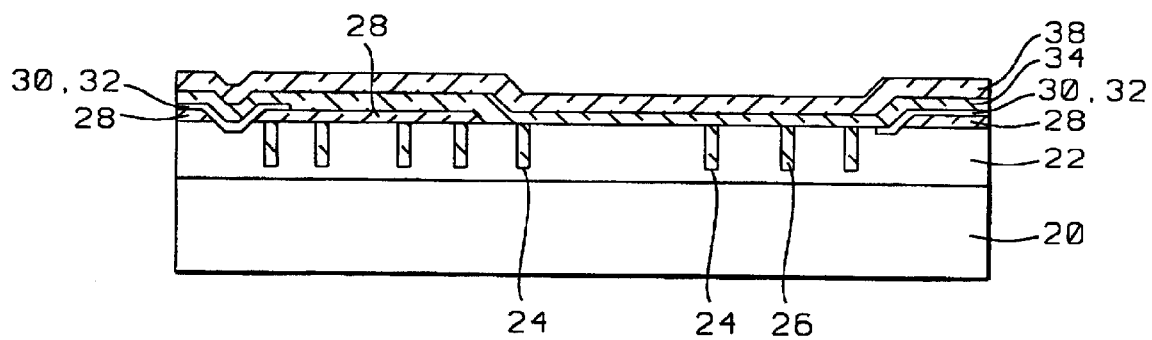

FIG. 5b is a cross-sectional view of the device after nitride and poly-silicon protection layers are deposited and etched; sac-2 and sac-3 oxide deposition.

Figure 6B:
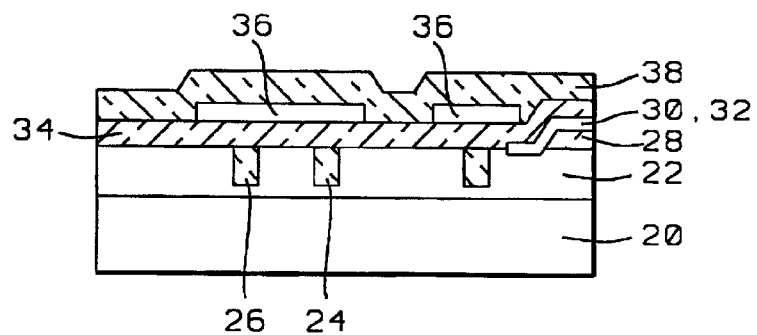

FIG. 6b is a cross-sectional view of the device after nitride and poly-silicon protection layers are deposited and etched; sac-2 and sac-3 oxide deposition; structural poly-silicon layer deposition and etching.

Figure 5C:
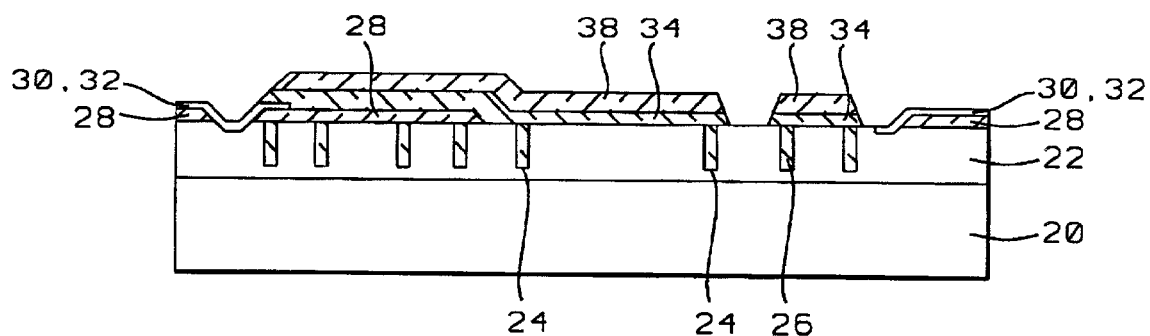
Figure 6C:
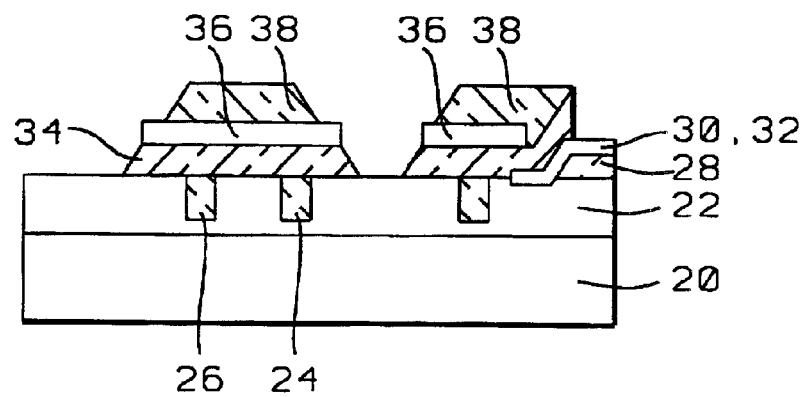

FIGS. 5c and 6c are cross-sectional views of the device after pattern etching of sac-2 and sac-3 oxides.

Figure 5D:
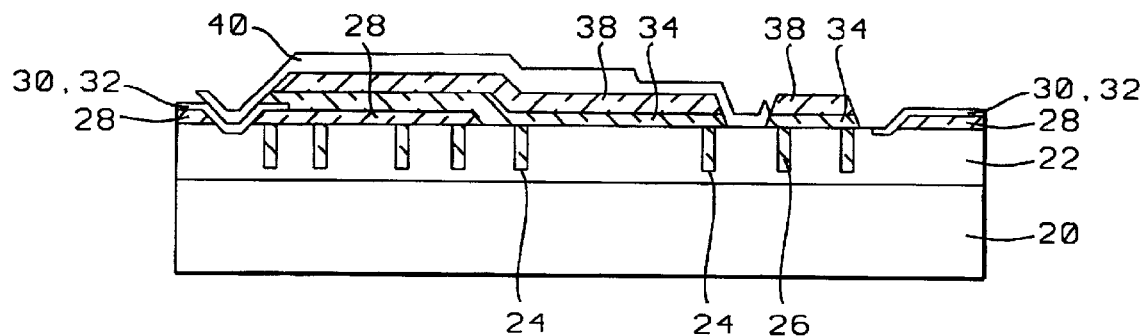

FIG. 5d is a cross-sectional view of the device after structural poly-silicon layer-2 deposition and pattern etching.

Figure 6D:
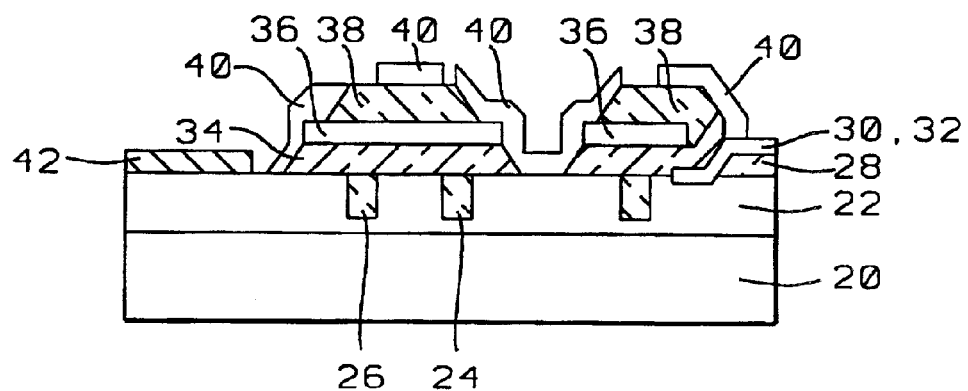

FIG. 6d is a cross-sectional view of the device after structural poly-silicon layer-2 deposition and pattern etching; mirror metal deposition and etching.

Figure 5E:
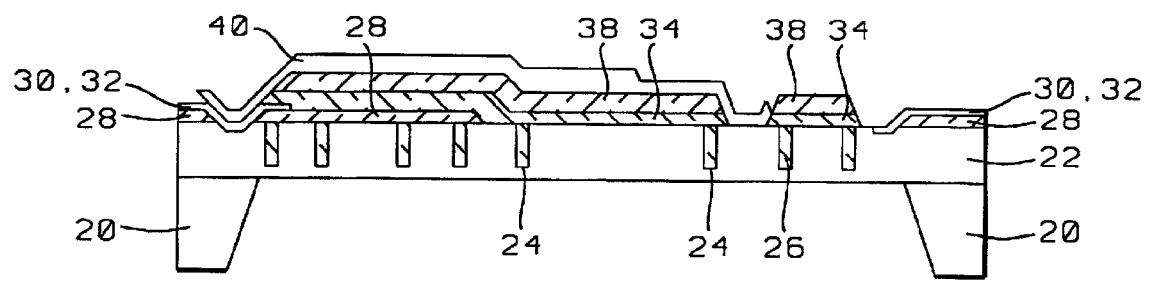
Figure 6E:
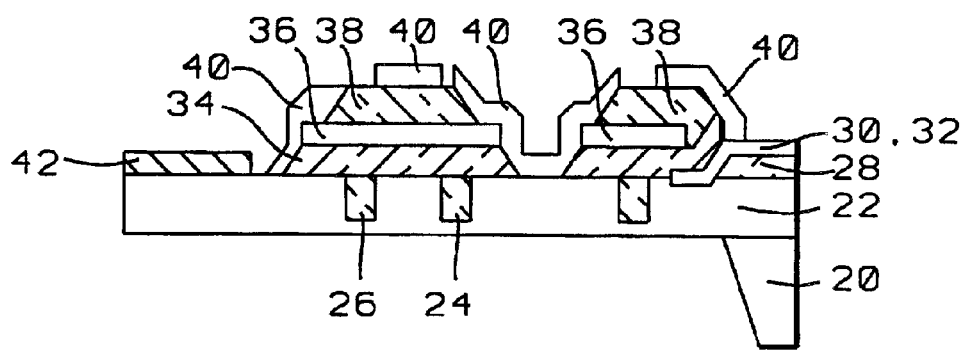

FIGS. 5e and 6e are cross-sectional views of the device after KOH etching of backside silicon.

Figure 5F:
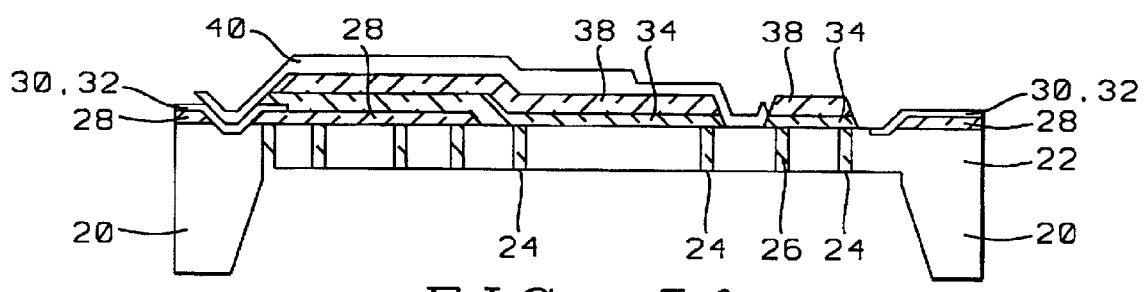
Figure 6F:
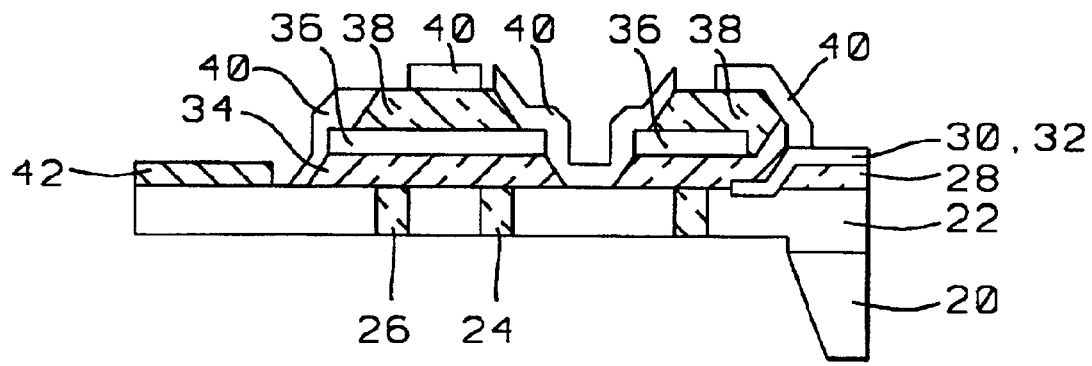

FIGS. 5f and 6f are cross-sectional views of the device after reactive ion etching of silicon to expose silicon dioxide-filled trenches from the bottom.

Figure 5G:
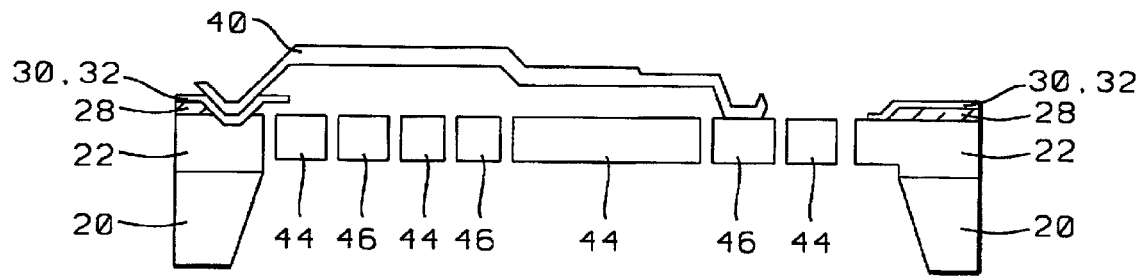
Figure 6G:
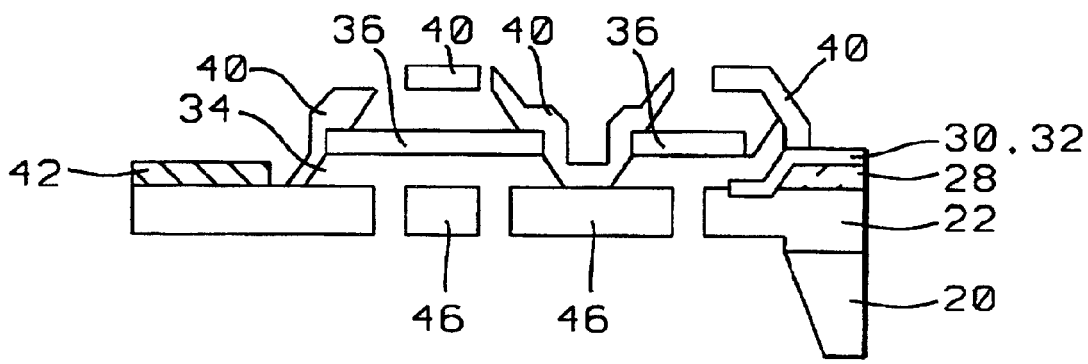

FIGS. 5g and 6g are cross-sectional views of the device after sacrificial etching of silicon dioxide through the trenches and from top.

Figure 5H:
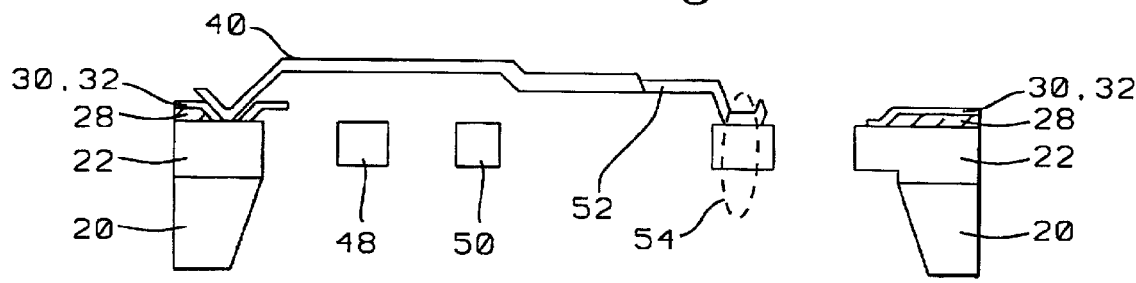

FIG. 5h is a cross-sectional view of the final structure after the oxide and some of the silicon blocks are sacrificially removed, showing lower fixed silicon electrode, landing pad and silicon hinge parts.

Figure 6H:
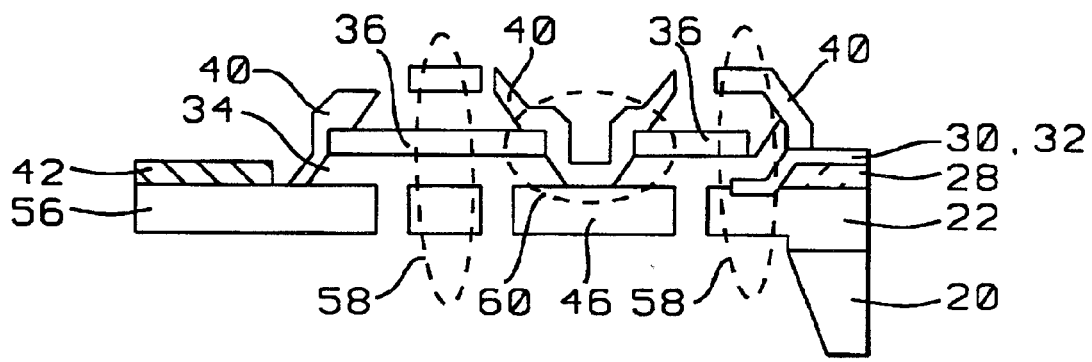

FIG. 6h is a cross-sectional view of the final structure after the oxide and some of the silicon blocks are sacrificially removed, showing hinges, hinge bar, and mirror.

DESCRIPTION OF THE PREFERRED EMBODIMENTS

Figure 2:
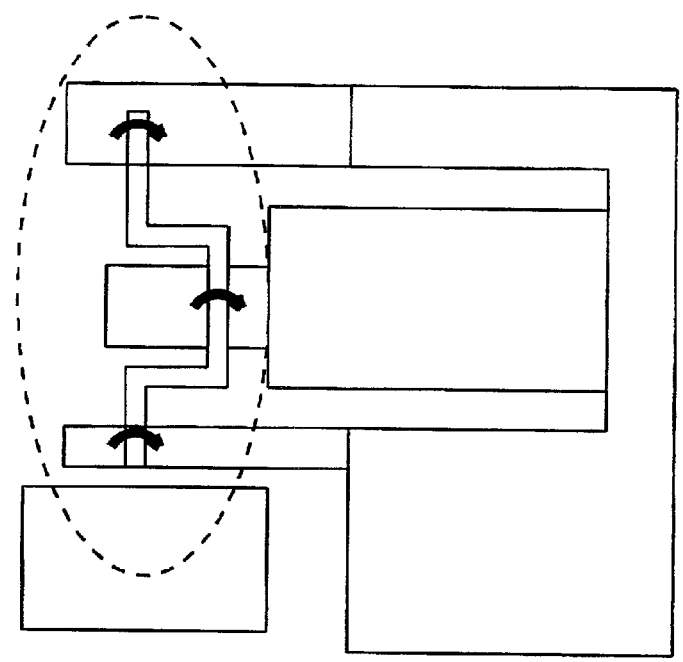
FIG. 2 shows the top view of free hinge only design of the hinge mechanism for implementing angular amplification.
Figure 3:
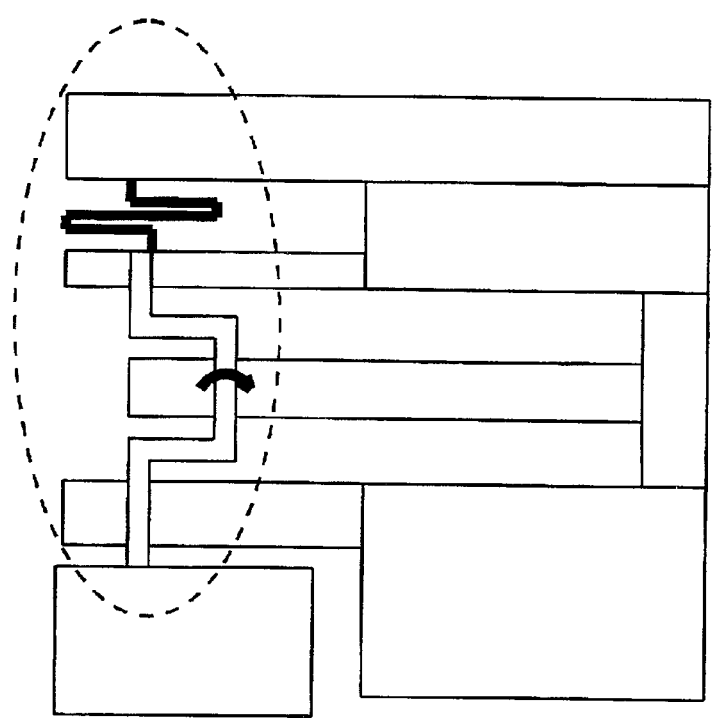
FIG. 3 shows the top view of flexure spring and free hinge design for implementing angular amplification.
Figure 4:
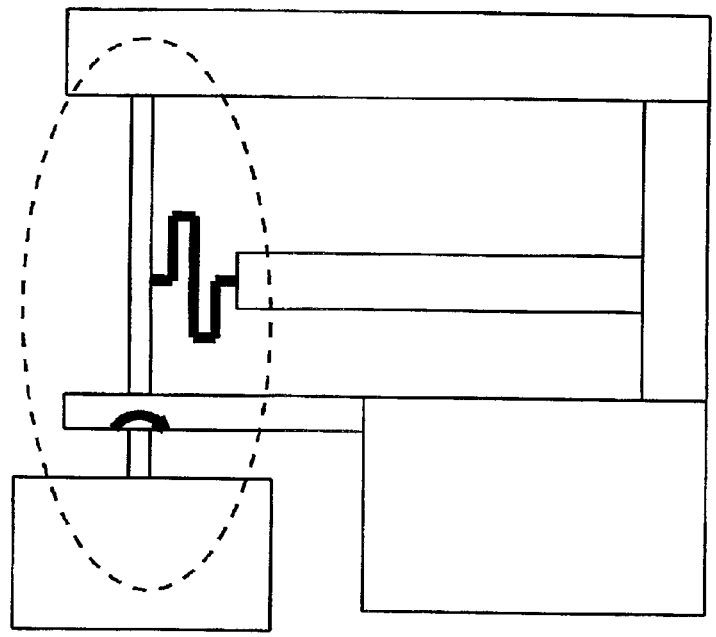
FIG. 4 shows the top view of torsion spring and flexure spring design for implementing angular amplification.

The top view of the micro-mirror switching device with micro-mirror region 10, secondary actuator region 12, and hinge & spring region 14, is shown in FIG. 1. The hinge and spring element integrates the micro-mirror and the actuator elements. Electrostatic actuator consisting of upper cantilever-type moving poly-silicon electrode and lower stationary silicon electrode moves the mirror through hinge and spring mechanism. Several combinations or hinge and spring elements are used: free hinge and lever arm (not shown); free hinge only combination (FIG. 2); flexure spring (not shown); flexure spring and free hinge (FIG. 3); free hinge and flexure spring (not shown); torsion spring and flexure spring (FIG. 4). Integration scheme according to the present invention implements the angular amplification concept for achieving large angular displacements for micromirrors with smaller bending of secondary cantilever-type actuators.

FIGS. 5a through 5h and 6a through 6h describe the process steps for forming the micro-mirror switching device. All the elements of the device are formed simultaneously during the described process steps.

FIG. 5a and FIG. 6a are cross-sectional views of the device along axis 5A and axis 6B respectively (shown by dashed lines 5A and 6B in FIG. 1) after several process steps as described herein is completed. A p-n junction is first formed on p-type silicon 20 n-type silicon 22 is then formed either by diffusion or alternatively by depositing epitaxial silicon film. The depth of p-n junction is kept approximately at about 8–10 μm. Trenches 24, approximately about 1–3 μm wide and about 4–8 μm deep, are etched in silicon with a deep reactive ion etching process, known in prior art (U.S. Pat. No. 5,501,893). The said trenches define the close-loop rectangular boundaries of the various regions 10, 12, and 14 (shown in FIG. 1). Silicon dioxide 26 is then filled within the trenches and the wafer surface is planarized using plasma etch back or chemical mechanical polishing methods, known in prior art. Silicon dioxide 28, later used as sacrificial layer-1 (sac-1) is deposited on the said planar surfaces and patterned. Resulting structures are shown in FIGS. 5a and 6a.

Nitride 30 and poly-silicon 32 films, both used to protect field area oxide, are deposited next and patterned. Sacrificial silicon dioxide layer-2 (sac-2) 34 is then deposited but not patterned, as shown in FIGS. 5b and 6b. Structural poly-silicon layer-1 (poly-1) 36 is then deposited and patterned (shown only in FIG. 6b) to partly define spring/hinge elements.

Next, sacrificial silicon dioxide layer-3 (sac-3) 38 is deposited and patterned as shown in FIGS. 5c and 6c.

Structural poly-silicon layer-2 (poly-2) 40 is deposited next and patterned, as shown in FIGS. 5d and 6d. Poly silicon actuator and hinge/spring mechanism are fully defined at this process step. Mirror-metal is then deposited and the metal patterned to form the micro-mirror 42 as shown in FIG. 6d (only). At this step, all of the components are fabricated in single crystal silicon, but not separated or released to form working device elements.

The following steps describe the release process to cut the device structures in single crystal silicon and form the individual elements:

i) Backside silicon 20 is etched electrochemically preferably in aqueous potassium hydroxide (KOH) solution to stop at the n-p junction with diffused n-type silicon 22 exposed. Other etching mediums can be substituted for the preferred aqueous KOH solution. These alternate chemicals include aqueous solution of ethylene diamine, pyrocatechol, and/or TMAH-isopropenol. A silicon window is opened from the backside of the wafer in this step. The resulting structure is shown in FIGS. 5e and 6e.

ii) Next, backside n-type silicon 22 is etched within said KOH-etched silicon window, using reactive ion etching (RIE) process in SF6 plasma, known in prior art, or using further KOH etching of silicon with time control, such that the silicon dioxide-filled trenches 26 are exposed at the bottom as shown in FIGS. 5f and 6f.

iii) Silicon dioxide-filled trenches 26 are then sacrificially etched in HF solution of concentration approximately 49% HF in water at room temperature. In this step, silicon dioxide is removed both from trenches and from under the micro-machined structures. The resulting structures are shown in FIGS. 5g and 6g. The unsupported silicon blocks 44 get removed during this sacrificial etching step, while the silicon blocks 46 attached to structural poly-silicon layers remain in the final device. The final device structures are shown in FIGS. 5h and 6g/6h. In FIG. 5h, lower fixed silicon electrode 48, landing pad 50, spring part 52, and silicon/poly-silicon hinge 54 are shown. In FIG. 6h, mirror plate 56, free hinge 58, and silicon/poly-silicon hinge bar 60 are shown. The actuator shown in FIG. 5h is of the electrostatic cantilever type with supporting blocks 48 and 50.

When the actuator is of the thermal type, the cantilever would be formed of a bi-metal or generically of a bi-morph material; and the movement of the actuator takes place due to mismatch in the thermal coefficient of expansion of the two metals. The bi-morph cantilever is chosen from materials composed of silicon dioxide, silicon nitride, poly silicon, and/or the heater material is chosen from aluminum, titanium nitride, aluminum-titanium alloy, and/or poly silicon. In terms of the process to incorporate the thermal actuator in the said micro-mirror device, the silicon blocks 48 and 50 are also sacrificed during etching. The remaining process steps are identical to those used in incorporating the electrostatic type of actuator.

The advantages of the present invention of forming the MEMS micro-mirror switching device over the prior art are as follows:

1. Micro-mirror switches fabricated on single crystal silicon using conventional semiconductor device methods are flatter and therefore able to steer the light beam more precisely.
2. The switching device is formed using both surface micro machining and bulk micro-machining methods, thereby retaining the advantages of both methods.
3. Electrostatic, cantilever design of poly-silicon actuator allows higher angular rotation of the mirror with small displacement of the actuator tip.
4. New angular amplification concept allows the use of minimum space for forming the actuator in the device for large angular bending.
5. The invention method of fabrication uses a unique process of forming and using oxide-filled trenches (which are later sacrificially etched) that allows silicon to be used as both sacrificial and structural layers.
6. A new release process is used where, after electrochemical etching of a window in backside silicon, reactive ion etching is used to expose $SiO_2$-filled trenches and sacrificing the oxide through trenches and from the top.

While the preferred embodiment of the invention has been described, it will be understood by those skilled in the art that various modifications in form and details may be made without departing from the spirit and scope of the invention. Accordingly, other embodiments are within the scope of the following claims:

What is claimed is:

1. A method of forming a single crystal micro-mirror switching device comprising:

forming n-type silicon on p-type silicon substrate;

forming a p-n junction;

forming deep trenches in n-type silicon;

filling said trenches with sacrificial silicon dioxide and planarizing said sacrificial silicon dioxide;

depositing sacrificial silicon dioxide layer-1 on said planarized surface and patterning said sacrificial silicon dioxide layer-1;

depositing protective dielectric layers over said sacrificial silicon dioxide layer-1 and patterning said dielectric layers;

depositing sacrificial silicon dioxide layer-2 over said patterned dielectric layers;

depositing poly-silicon layer-1 over said sacrificial silicon dioxide layer-2 and patterning said poly-silicon layer-1;

depositing sacrificial silicon dioxide layer-3 over said patterned poly-silicon layer-1 and patterning said sacrificial silicon dioxide layers-2 and -3;

depositing poly-silicon layer-2 over said patterned silicon dioxide layers-2 and -3 and patterning said poly-silicon layer-2;

forming metal mirror by depositing metal on the wafer and patterning metal;

forming the device structures with a release process comprising of multiple etching steps.

2. The method of forming a single crystal micro-mirror switching device according to claim 1, wherein n-type silicon is formed by process of diffusion.

3. The method of forming a single crystal micro-mirror switching device according to claim 1, wherein n-type silicon is formed by epitaxial deposition.

4. The method of forming a single crystal micro-mirror switching device according to claim 1, wherein p-n junction depth is approximately about 8–10 $\mu$m.

5. The method of forming a single crystal micro-mirror switching device according to claim 1, wherein said trenches in n-type silicon are approximately about 1–3 $\mu$m wide and approximately about 4–8 $\mu$m deep.

6. The method of forming a single crystal micro-mirror switching device according to claim 1, wherein said n-type silicon is both a sacrificial and a structural layer.

7. The method of forming a single crystal micro-mirror switching device according to claim 1, wherein said protective dielectric layers are selected from the group comprising silicon dioxide, silicon nitride and/or poly silicon.

8. The method of forming a single crystal micro-mirror switching device according to claim 1, wherein said poly silicon-1 and poly silicon-2 are structural layers.

9. The method of forming a single crystal micro-mirror switching device according to claim 1, wherein said mirror metal is selected from the group comprising aluminum, chromium, titanium, silver, platinum, and/or gold.

10. The method of forming a single crystal micro-mirror switching device according to claim 1, wherein said release process comprises:

electrochemical etching of back-side silicon in a base solution;

reactive ion etching silicon from backside of said n-type silicon; and etching said sacrificial silicon dioxide layer-1, layer-2, layer-3, and in filled trenches in hydrofluoric acid solutions.

11. The release method according to claim 10, wherein said backside of silicon wafer is etched selectively to stop on said n-type silicon.

12. The release method according to claim 10, wherein said backside of silicon wafer is etched electrochemically, and in the preferred embodiment, in potassium hydroxide (KOH) of concentration, 35% KOH in water at 75 C.

13. The release method according to claim 10, wherein n-type silicon is etched from the backside with reactive ion etching process in $SF_6$ plasma only as much to expose said oxide filled trenches.

14. The release method according to claim 10, wherein n-type silicon is etched, alternatively, in aqueous KOH with time control only as much to expose said oxide filled trenches.

15. The release method according to claim 10, wherein etching of said sacrificial silicon dioxide layer-1, layer-2, layer-3, and in filled trenches is done in 49% aqueous hydrofluoric acid solution at room temperature.

16. A release method to form structural components in single crystal silicon switching device; the method comprising:

forming a silicon structure with the steps comprising:

forming n-type silicon on a p-type silicon substrate to form a p-n junction;

forming deep trenches in said n-type silicon;
filling said deep trenches with sacrificial silicon dioxide;
planarizing said deep trenches to form a planarized surface;
depositing and patterning sacrificial silicon dioxide layer-1, layer2, and
layer-3 on said planarized surface;
etching of backside of silicon wafer in a selective manner;
etching of n-silicon in aqueous KOH from backside;
reactive ion etching silicon from backside of said n-type silicon only as much to expose said oxide filled trenches; and
etching of said sacrificial silicon dioxide layer-1, layer-2, layer-3, and in filled trenches.

17. A method of forming a MEMS device with silicon as structural and sacrificial layers comprising:
forming n-type silicon on p-type silicon substrate;
forming a p-n junction over a silicon substrate;
forming deep trenches in n-type silicon;
filling said trenches with sacrificial silicon dioxide and planarizing said sacrificial silicon dioxide;
depositing sacrificial silicon dioxide layer-1 on said planarized surface and patterning said sacrificial silicon dioxide layer-1;
depositing protective nitride and poly-silicon films over silicon dioxide layer-1 and patterning said nitride and poly-silicon films;
depositing sacrificial silicon dioxide layer-2 over said patterned nitride and poly-silicon;
depositing poly-silicon layer-1 over said sacrificial silicon dioxide layer-2 and patterning poly-silicon layer-1;
depositing sacrificial silicon dioxide layer-3 over said patterned poly-silicon layer-1 and patterning said sacrificial silicon dioxide layers-2 and -3;
depositing poly-silicon layer-2 over said patterned silicon dioxide layers-2 and -3 and patterning poly-silicon layer-2; and
forming the MEMS device with a release process comprising of multiple etching steps.

18. The method of forming a MEMS device according to claim 17, wherein said release process comprises:
electrochemical etching of back-side silicon preferably in KOH of concentration 35% KOH in water at 75° C.;
reactive ion etching silicon from backside of said n-type silicon only as much to expose said oxide filled trenches; and
etching said sacrificial silicon dioxide layer-1, layer-2, layer-3, and in filled trenches in hydrofluoric acid solutions.

19. A method of forming a single crystal micro-mirror comprising:
forming n-type silicon on p-type silicon substrate;
forming a p-n junction over a silicon substrate;
forming deep trenches in n-type silicon;
filling said trenches with sacrificial silicon dioxide and planarizing said sacrificial silicon dioxide;
depositing sacrificial silicon dioxide layer-1 on said planarized surface and patterning said sacrificial silicon dioxide layer-1;
depositing protective nitride and poly-silicon films over silicon dioxide layer-1 and patterning said nitride and poly-silicon films;
depositing sacrificial silicon dioxide layer-2 over said patterned nitride and poly-silicon;
depositing poly-silicon layer-1 over said sacrificial silicon dioxide layer-2 and patterning said poly-silicon layer-1;
depositing sacrificial silicon dioxide layer-3 over said patterned poly-silicon layer-1 and patterning said sacrificial silicon dioxide layers-2 and -3;
depositing poly-silicon layer-2 over said patterned silicon dioxide layers-2 and -3 and patterning said poly-silicon layer-2;
forming metal mirror by depositing metal on the wafer and patterning metal; and
forming the micro-mirror element with a release process comprising of multiple etching steps.

20. The method of forming a single crystal micro-mirror according to claim 19, wherein said mirror metal is selected from the group comprising aluminum, chromium, titanium, silver, platinum, and/or gold.

21. The method of forming a single crystal micro-mirror according to claim 19, wherein said release process comprises:
electrochemical etching of back-side silicon preferably in KOH of concentration 35% KOH in water at 75° C.;
reactive ion etching silicon from backside of said n-type silicon only as much to expose said oxide filled trenches; and
etching said sacrificial silicon dioxide layer-1, layer-2, layer-3, and in filled trenches in hydrofluoric acid solutions.

22. A method of forming an electrostatic actuator comprising:
forming n-type silicon on p-type silicon substrate;
forming a p-n junction over a silicon substrate;
forming deep trenches in n-type silicon;
filling said trenches with sacrificial silicon dioxide and planarizing said sacrificial silicon dioxide;
depositing sacrificial silicon dioxide layer-1 on planarized surface and patterning said sacrificial silicon dioxide layer-1;
depositing protective nitride and poly-silicon films over said sacrificial silicon dioxide layer-1 and patterning said nitride and poly-silicon films;
depositing sacrificial silicon dioxide layer-2 over said patterned nitride and poly-silicon;
depositing poly-silicon layer-1 over said sacrificial silicon dioxide layer-2 and patterning said poly-silicon layer-1;
depositing sacrificial silicon dioxide layer-3 over said patterned poly-silicon layer-1 and patterning said sacrificial silicon dioxide layers-2 and -3;
depositing poly-silicon layer-2 over said patterned silicon dioxide layers-2 and -3 and patterning said poly-silicon layer-2; and
forming the actuator element with a release process comprising of multiple etching steps.

23. The method of forming an electrostatic actuator according to claim 22 wherein said release process comprises:
electrochemical etching of back-side silicon preferably in KOH of concentration 35% KOH in water at 75° C.;
reactive ion etching silicon from backside of said n-type silicon only as much to expose said oxide filled trenches; and
etching said sacrificial silicon dioxide layer-1, layer-2, layer-3, and in filled trenches in hydrofluoric acid solutions.

24. A method of forming hinge and spring element comprising:
- forming n-type silicon on p-type silicon substrate,
- forming a p-n junction over a silicon substrate;
- forming deep trenches in n-type silicon;
- filling said trenches with sacrificial silicon dioxide and planarizing said sacrificial silicon dioxide;
- depositing sacrificial silicon dioxide layer-1 on said planarized surface and patterning said sacrificial silicon dioxide layer-1;
- depositing protective nitride and poly-silicon films over said silicon dioxide layer-1 and patterning said nitride and poly-silicon films;
- depositing sacrificial silicon dioxide layer-2 over said patterned nitride and poly-silicon;
- depositing poly-silicon layer-1 over said sacrificial silicon dioxide layer-2 and patterning said poly-silicon layer-1;
- depositing sacrificial silicon dioxide layer-3 over said patterned poly-silicon layer-1 and patterning said sacrificial silicon dioxide layers-2 and -3;
- depositing poly-silicon layer-2 over said patterned silicon dioxide layers-2 and -3 and patterning said poly-silicon layer-2; and
- forming the hinge and spring element with a release process comprising of multiple etching steps.

25. The method of forming a hinge and spring mechanism according to claim 24, wherein said release process comprises:
- electrochemical etching of back-side silicon preferably in KOH of concentration 35% KOH in water at 75° C.;
- reactive ion etching silicon from backside of said n-type silicon only as much to expose said oxide filled trenches; and
- etching said sacrificial silicon dioxide layer-1, layer-2, layer-3, and in filled trenches in hydrofluoric acid solutions.

26. A method of forming a thermal actuator comprising:
- forming n-type silicon on p-type silicon substrate;
- forming a p-n junction over a silicon substrate;
- forming deep trenches in n-type silicon;
- filling said trenches with sacrificial silicon dioxide and planarizing said sacrificial silicon dioxide;
- depositing sacrificial silicon dioxide layer-1 on said planarized surface and patterning said sacrificial silicon dioxide layer-1;
- depositing protective nitride and poly-silicon films over said sacrificial silicon dioxide layer-1 and patterning said nitride and poly-silicon films;
- depositing sacrificial silicon dioxide layer-2 over said patterned nitride and poly-silicon;
- depositing poly-silicon layer-1 over said sacrificial silicon dioxide layer-2 and patterning said poly-silicon layer-1;
- depositing sacrificial silicon dioxide layer-3 over said patterned poly-silicon layer-1 and patterning said sacrificial silicon dioxide layers-2 and -3;
- depositing poly-silicon layer-2 over said patterned silicon dioxide layers-2 and -3 and patterning said poly-silicon layer-2; and
- forming the actuator element with a release process comprising of multiple etching steps.

27. The method of forming a thermal actuator according to claim 26, wherein said release process comprises:
- electrochemical etching of back-side silicon preferably in KOH of concentration 35% KOH in water at 75° C.;
- reactive ion etching silicon from backside of said n-type silicon only as much to expose said oxide filled trenches; and
- etching said sacrificial silicon dioxide layer-1, layer-2, layer-3, and in filled trenches in hydrofluoric acid solutions.

* * * * *